United States Patent
Cutts et al.

(10) Patent No.: US 7,240,236 B2
(45) Date of Patent: Jul. 3, 2007

(54) FIXED CONTENT DISTRIBUTED DATA STORAGE USING PERMUTATION RING ENCODING

(75) Inventors: Shaun Cutts, Allston, MA (US); Andres Rodriguez, Newton, MA (US)

(73) Assignee: Archivas, Inc., Waltham, MA (US)

( * ) Notice: Subject to any disclaimer, the term of this patent is extended or adjusted under 35 U.S.C. 154(b) by 554 days.

(21) Appl. No.: 10/806,488

(22) Filed: Mar. 23, 2004

(65) Prior Publication Data

US 2005/0216813 A1    Sep. 29, 2005

(51) Int. Cl.
*G06F 11/08* (2006.01)
*H03M 13/13* (2006.01)
*G06F 11/10* (2006.01)

(52) U.S. Cl. .......................................... 714/6; 714/752
(58) Field of Classification Search ................ 714/752, 714/776, 770, 6
See application file for complete search history.

(56) References Cited

U.S. PATENT DOCUMENTS

| | | | |
|---|---|---|---|
| 5,485,474 A | | 1/1996 | Rabin |
| 5,644,695 A | * | 7/1997 | Blaum et al. ................ 714/6 |
| 6,088,330 A | * | 7/2000 | Bruck et al. ................ 370/228 |
| 6,370,670 B1 | * | 4/2002 | Le Dantec et al. ......... 714/781 |
| 6,614,366 B2 | | 9/2003 | Luby |
| 7,133,853 B2 | * | 11/2006 | Richardson et al. .......... 706/15 |

2005/0088986 A1 * 4/2005 Sun et al. ................ 370/316

OTHER PUBLICATIONS

Good et al., "A Robust Storage System Architecture," Technical Report: CS-95-10, Dept. of Computer Science, University of Waterloo, Mar. 9, 1995.
Bestavros, "A VLSI Chip for the Real-time Information Dispersal and Retrieval for Security and Fault-Tolerance," Harvard University, Sep. 1989.
Plank, "A Tutorial on Reed-Solomon Coding for Fault-Tolerance in RAID-like Systems," Technical Report UT-CS-96-332, Dept. of Comp. Science, Univ. of Tennessee, Jul. 19, 1996.

* cited by examiner

Primary Examiner—Stephen M. Baker
(74) Attorney, Agent, or Firm—David H. Judson

(57) ABSTRACT

A file protection scheme for fixed content in a distributed data archive uses computations that leverage permutation operators of a cyclic code. In an illustrative embodiment, an N+K coding technique is described for use to protect data that is being distributed in a redundant array of independent nodes (RAIN). The data itself may be of any type, and it may also include system metadata. According to the invention, the data to be distributed is encoded by a dispersal operation that uses a group of permutation ring operators. In a preferred embodiment, the dispersal operation is carried out using a matrix of the form $[I_N\_C]$ where $I_N$ is an n×n identity sub-matrix and C is a k×n sub-matrix of code blocks. The identity sub-matrix is used to preserve the data blocks intact. The sub-matrix C preferably comprises a set of permutation ring operators that are used to generate the code blocks. The operators are preferably superpositions that are selected from a group ring of a permutation group with base ring $Z_2$.

20 Claims, 2 Drawing Sheets

- ANY N+K CODING ALGORITHM CAN BE REPRESENTED IN MATRIX FORM (m = n+k):

- WHERE $c_i = f_i(g_{i1}(C_1), ..., g_{in}(c_n))$

- ANY N+K CODING ALGORITHM CAN BE REPRESENTED IN MATRIX FORM (m = n+k):

- WHERE $c_i = f_i(g_{i1}(C_1), ..., g_{in}(c_n))$ $$
\begin{array}{lllllll}
(1+c)A & & & & & & \\
= & & & & & & \\
1A & a_1 & a_2 & \cdots & a_{m-2} & a_{m-1} & a_m \\
cA & a_m & a_1 & \cdots & a_{m-3} & a_{m-2} & a_{m-1} \\
\hline
+\text{ key} & a_1 & & & & & \\
= & \overline{a_m} & & & & & \\
\end{array}
$$

$$
\begin{array}{r}
+\ a_m \\ \hline
a_{m-1}
\end{array}
$$

$$
\begin{array}{r}
+\ a_{m-1} \\ \hline
a_{m-2}
\end{array}
$$

$$
\begin{array}{r}
+\ a_{m-2} \\ \hline
a_{m-3}
\end{array}
$$

$$\cdots$$

$$
\begin{array}{r}
+\ a_2 \\ \hline
a_1
\end{array}
$$

*FIG. 3*

FIXED CONTENT DISTRIBUTED DATA STORAGE USING PERMUTATION RING ENCODING

BACKGROUND OF THE INVENTION

1. Technical Field

The present invention relates generally to techniques for highly available, reliable, and persistent data storage in a distributed computer network.

2. Description of the Related Art

A need has developed for the archival storage of "fixed content" in a highly available, reliable and persistent manner that replaces or supplements traditional tape and optical storage solutions. The term "fixed content" typically refers to any type of digital information that is expected to be retained without change for reference or other purposes. Examples of such fixed content include, among many others, e-mail, documents, diagnostic images, check images, voice recordings, film and video, and the like. The traditional Redundant Array of Independent Nodes (RAIN) storage approach has emerged as the architecture of choice for creating large online archives for the storage of such fixed content information assets. By allowing nodes to join and exit from a cluster as needed, RAIN architectures insulate a storage cluster from the failure of any one or more nodes. By replicating data on multiple nodes, RAIN-type archives can automatically compensate for node failure or removal. Typically, RAIN systems are largely delivered as hardware appliances designed from identical components within a closed system.

A representative archive comprises storage nodes that provide the long-term data storage, and access nodes that provide the interface through which data files enter the archive. To protect files, typically one of several possible schemes are used. These well-known file protection schemes include simple file mirroring, RAID-5 schemes that spread the file contents across multiple nodes using a recovery stripe to recreate any missing stripes, or variations on RAID 5 that use multiple recovery stripes to ensure that simultaneous node failures do not lead to overall system failure. One such variation is the Information Dispersal Algorithm (IDA), original developed by Rabin and described in U.S. Pat. No. 5,485,474. Rabin IDA itself is a variant of a Reed-Solomon error correcting code, such as a linear block code used to ensure data integrity during transmission over a communications channel. Rabin IDA breaks apart a data file so that the pieces can be distributed to multiple sites for fault tolerance without compromising the integrity of the data. In particular, IDA uses matrix algebra over finite fields to disperse the information of a file F into n pieces that are transmitted or stored on n different machines (or disks) such that the contents of the original file F can be reconstructed from the contents of any m of its pieces, where $m \leq n$. Because of the way in which the data is broken up, only a subset of the original pieces are required to reassemble the original data. In IDA, an important objective is to ensure integrity of the dispersed data, and this is accomplished by ensuring that each fragment of the data is not usable, in of itself, to recover the original data. This requirement is undesirable, as it is preferred to have as much of the data as possible freely available (as there may be no loss during transmission or storage), so that the checksum pieces are only used to reconstruct any of the original data that may be unavailable. Moreover, while Rabin IDA provides fault tolerance and data security, it is not computationally efficient, especially as the size of the file increases.

To address this problem, other types of error correcting codes with smaller computational requirements were developed. Tornado codes are similar to Reed-Solomon codes in that an input file is represented by K input symbols and is used to determine N output symbols, where N is fixed before the encoding process begins. In this approach, after a file is partitioned into a set of equal size fragments (called data nodes), a set of check nodes that are equal in size and population are then created. The encoding of the file involves a series of specially designed bipartite graphs. Each check node is assigned two or more nodes to be its neighbors, and the contents of the check node is set to be the bit-wise XOR of the value of its neighbors. The nodes are sequentially numbered, and the encoded file is distributed containing one or more nodes. Decoding is symmetric to the encoding process, except that the check nodes are used to restore their neighbors. To restore a missing node, the contents of the check node is XORed with the contents of certain neighbor nodes, and the resulting value is assigned to the missing neighbor. Tornado codes provide certain advantages but also have limitations. Among other issues, a graph is specific to a file size, so a new graph needs to be generated for each file size used. Furthermore, the graphs needed by the Tornado codes are complicated to construct, and they require different custom settings of parameters for different sized files to obtain the best performance. These graphs are usually quite large and require a significant amount of memory for their storage.

Still another approach to the problem of protecting content in distributed storage is described in U.S. Pat. No. 6,614,366, to Luby et al, which also purports to address limitations and deficiencies in Tornado coding. In this patent, an encoder uses an input file of data and a key to produce an output symbol. An output symbol with key I is generated by determining a weight, W(I), for the output symbol to be generated, selecting W(I) of the input symbols associated with the output symbol according to a function of I, and generating the output symbol's value B(I) from a predetermined value function F(I) of the selected W(I) input symbols. An encoder can be called repeatedly to generate multiple output symbols. The output symbols are generally independent of each other, and an unbounded number (subject to the resolution of I) can be generated, if needed. A decoder receives some or all of the output symbols generated. The number of output symbols needed to decode an input file is equal to, or slightly greater than, the number of input symbols comprising the file, assuming that input symbols and output symbols represent the same number of bits of data are then created. This approach is said to provide certain advantages over Tornado or other Reed-Solomon based coding techniques.

While the approaches described above are representative of the prior art and can provide fault tolerant and secure storage, there remains a need to improve the state of the art, especially as it relates to the problem of reliable and secure storage of fixed content, especially across heterogeneous RAIN archives.

BRIEF SUMMARY OF THE INVENTION

It is a general object of the present invention to provide for highly available, reliable and persistent storage of fixed content in an archive.

It is another object of the invention to provide an improved file protection scheme for fault tolerant and secure storage of a fixed content in a Redundant Array of Independent Nodes (RAIN) architecture, and preferably an architecture that does not require homogenous machines or devices.

It is still another object of the invention to provide a novel file protection scheme for fixed content in a heterogeneous RAIN archive that overcomes the deficiencies of prior art approaches and that is computationally efficient in both encoding and decoding operations.

A still further and more specific object of the present invention is to implement a file protection scheme for fixed content in a distributed data archive using matrix computations that leverage a permutation operation that comprises a superposition of cycle permutations.

According to the present invention, an N+K coding technique is described for use to protect data that is being distributed in a redundant array of independent nodes (RAIN). The data itself may be of any type, and it may also include system metadata. According to the invention, the data to be distributed is encoded by a dispersal operation that uses a group of permutation ring operators. In a preferred embodiment, the dispersal operation is effected using a matrix of the form $[I_N\_C]$ where $I_N$ is an n×n identity sub-matrix and C is a k×n sub-matrix of code blocks. The identity sub-matrix is used to preserve the original data. The sub-matrix C preferably comprises a set of permutation ring operators that are used to generate the code blocks. The operators are preferably "polynomials" that are selected from a group ring of a permutation group with base ring $Z_2$, e.g., a set of permutations whose action on the data is taken to be the XOR of the actions of the individual permutations The $i^{th}$ code block is computed as: $C_i=f(g_{i1}(A_1), \ldots g_{in}(A_n))$, where f( ) is preferably addition mod 2 (i.e., XOR), and g( ) is a permutation operator as described above. Each code block is preferably stored on a separate node.

In a more specific embodiment, an N+K (4,2) coding scheme is implemented. In this case, a file to be archived comprises four (4) data blocks (A1, A2, A3, A4). A dispersal matrix comprises six (6) code blocks (C0, C1, C2, C3, C4, C5). Because the identity sub-matrix is used, however, the first four code blocks (C0, C1, C2, C3) are just copies of the first four data blocks, and these data blocks are then stored in four distinct nodes of the array. The sub-matrix C is then generated as follows. Assume that g is a permutation operator that comprises a polynomial of cyclic permutations, such as: $b_0*c^0+b_1*c^1+b_k c^k+ \ldots b_{(m-1)}*c^{(m-1)}$, where $b_k$ is a bit (0 or 1), $c^0$ is the identity ("do nothing to the data"), and $c^k$ is a cycle operation c repeated k times, e.g., the operation: "cycle the data k words." The $i^{th}$ code block is then computed as: $C_i=f(g_{i1}(A_1), \ldots g_{in}(A_n))$. The C4 code block is then stored in the $5^{th}$ node, and the C5 code block is stored in the $6^{th}$ node to complete the encoding process.

The foregoing has outlined some of the more pertinent features of the invention. These features should be construed to be merely illustrative. Many other beneficial results can be attained by applying the disclosed invention in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings, in which:

FIG. 3 is an illustrative de-convolution operation according to the present invention.

DETAILED DESCRIPTION OF AN ILLUSTRATIVE EMBODIMENT

The present invention preferably is implemented in a scalable disk-based archival storage management system, preferably a system architecture based on a heterogeneous redundant array of independent nodes. Using the present invention, enterprises can create permanent storage for fixed content information such as documents, e-mail, satellite images, diagnostic images, check images, voice recordings, video, and the like, among others. High levels of reliability are achieved by replicating data on independent servers, or so-called storage nodes. Preferably, each node is symmetric with its peers. Thus, because any given node can perform all functions, the failure of any one node has little impact on the archive's availability.

Figure 1:
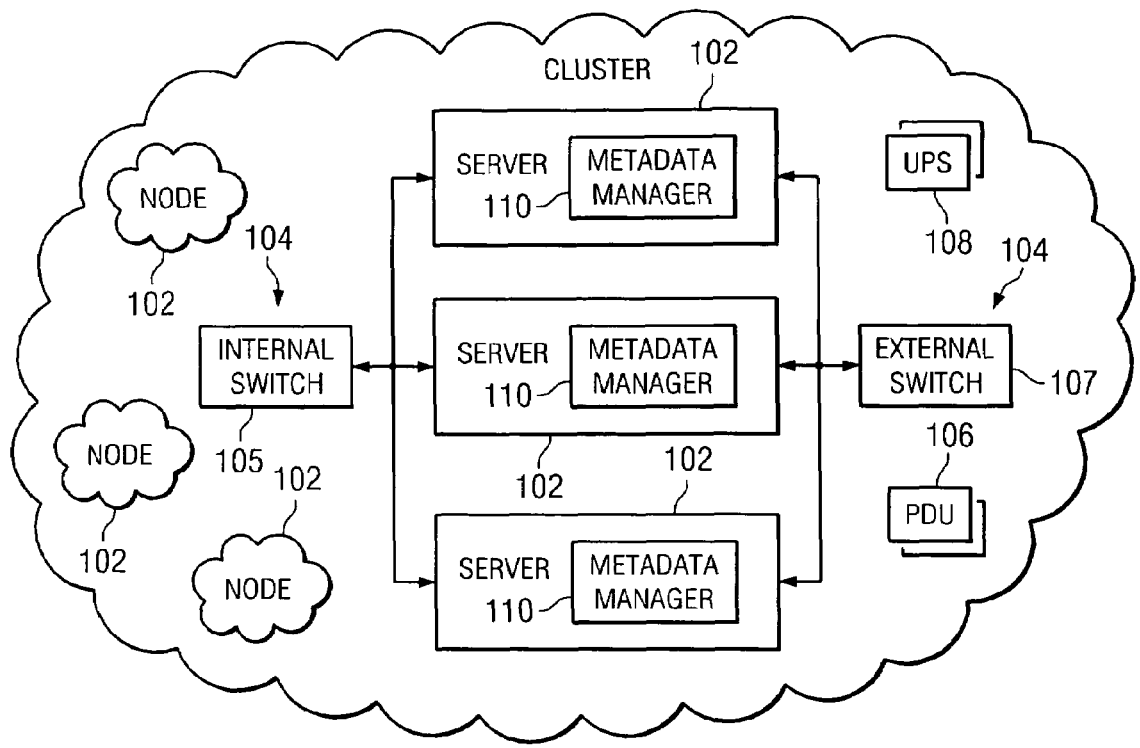
FIG. 1 is a simplified block diagram of a fixed content storage archive in which the file protection scheme of the present invention may be implemented.

In a representative embodiment, the invention is implemented in an archive that is designed to capture, preserve, manage, and retrieve digital assets. In an illustrated embodiment of FIG. 1, a physical boundary of an individual archive is referred to herein as a cluster. Typically, a cluster is not a single device, but rather a collection of devices. Devices may be homogeneous or heterogeneous. A typical device is a computer or machine running an operating system such as Linux. Clusters of Linux-based systems hosted on commodity hardware provide an archive that can be scaled from a few storage node servers to many nodes that store thousands of terabytes of data. This architecture ensures that storage capacity can always keep pace with an organization's increasing archive requirements. Preferably, data is replicated across the cluster so that the archive is always protected from device failure. If a disk or node fails, the cluster automatically fails over to other nodes in the cluster that maintain replicas of the same data.

An illustrative cluster preferably comprises the following general categories of components: nodes 102, a pair of network switches 104, power distribution units (PDUs) 106, and uninterruptible power supplies (UPSs) 108. A node 102 typically comprises one or more commodity servers and contains a CPU (e.g., Intel x86, suitable random access memory (RAM), one or more hard drives (e.g., standard IDE/SATA, SCSI, or the like), and two or more network interface (NIC) cards. A typical node is a 2U rack mounted unit with a 2.4 GHz chip, 512 MB RAM, and six (6) 200 GB hard drives. The network switches 104 typically include an internal switch 105 that enables peer-to-peer communication between nodes, and an external switch 107 that allows extra-cluster access to each node. Each switch requires enough ports to handle all potential nodes in a cluster. Ethernet or GigE switches may be used for this purpose. PDUs 106 are used to power all nodes and switches, and the UPSs 108 are used that protect all nodes and switches. Although not meant to be limiting, typically a cluster is connectable to a network, such as the publicly-routed Internet, an enterprise intranet, or other wide area or local area network. In an illustrative embodiment, the cluster is implemented within an enterprise computing environment. It may be reached, for example, by navigating through a site's corporate domain name system (DNS) name server. Thus, for example, the cluster's domain may be a new sub-domain of an existing domain. In a representative implementation, the sub-domain is delegated in the corporate DNS server to the name servers in the cluster itself. End users access the cluster using any conventional interface or access tool. Thus, for example, access to the cluster may be effected over any IP-based protocol (HTTP, FTP, NFS, SMB, or the like), via an application programming interface (API), or through any other known or later-developed access method, service, program or tool.

The cluster stores metadata for each file as well as its content. This metadata preferably is maintained in a database that is distributed evenly among all nodes in the cluster. To this end, each node includes a metadata manager 110. When new nodes are added to the cluster, individual node responsibilities are adjusted to the new capacity; this includes redistributing metadata across all nodes so that new members assume an equal share. Conversely, when a node fails or is removed from the cluster, other node metadata managers compensate for the reduced capacity by assuming a greater share. To prevent data loss, metadata information preferably is replicated across multiple nodes, where each node is directly responsible for managing some percentage of all cluster metadata, and copies this data to a set number of other nodes.

Protection of data in the archive requires a data protection scheme. Although simple techniques such as RAID-1 (mirroring) and RAID-5 (parity) may be implemented, the present invention implements a new N+K protection scheme, as will be described below. To prevent data corruption and/or sabotage, a file being inserted into the cluster may be authenticated in any convenient manner, e.g., by assigning a digital signature that is generated from the actual content of the file. The archive can periodically check the authenticity of the stored file's content by regenerating this signature from the stored content and comparing it to the original signature. The signatures must match in order to verify data authenticity.

The novel data protection scheme of the invention is now described. By way of brief background, it is well known that the goal of block erasure codes is to encode data into blocks so that, even if a certain number of blocks are lost, the original data is recoverable. Block erasure schemes are typically characterized by three (3) parameters (n, k, r), where: n is the number of original data blocks, n+k+r=t is the total number of code blocks, k is the number of code blocks that can be lost with the original data still recoverable, and r representing the extra code blocks needed that contain additional redundant information. For example, the simplest scheme is to just store c copies of the data. This is a (n, c−1, (c−1)(n−1)) scheme, as any c−1 lost blocks can be recovered, but c*n blocks must be stored. This type of scheme has a large redundancy cost.

For a desired n and k, a useful scheme has the following properties: minimize r (ideally r=0); efficient encode and decode operations, and implementation of the scheme in a systematic manner, in particular, wherein data blocks stored in clear, making decoding trivial if nothing is lost. The prototype "r=0" scheme for k=1 is a block parity scheme, where the blocks are taken to be bit vectors that are XORed together (i.e., the $i^{th}$ bit of the result is the XOR or the $i^{th}$ bit of each of the vectors). The result is stored as an additional code block $C_{\{n+1\}}$. Then, if any one block is lost, the information can be recovered by simply XORing the remaining blocks with $C_{\{n+1\}}$. This operation cancels out the contributions of the remaining block, leaving the original block.

Figure 2:
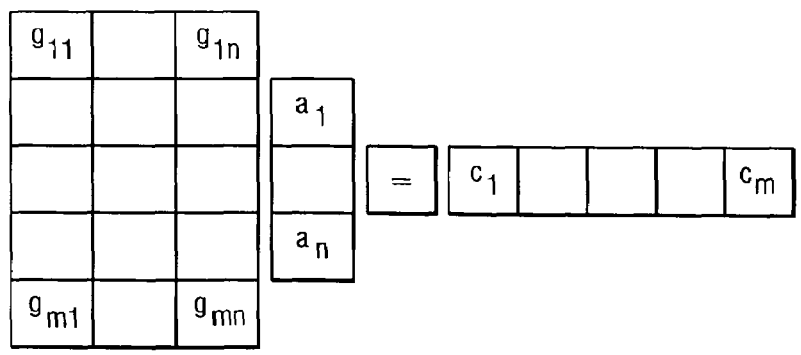
FIG. 2 is a simplified representation of an N+K coding algorithm that underlies the theory of operation of the file protection scheme of the invention.

Any scheme that reduces r from (c−1)(n−1) of the "copying" scheme involves using code blocks that somehow mix the data. In general, any such mixing can be thought of in terms of a matrix product such as illustrated in FIG. 2. In this example, G is a t by n matrix, and A is an n column vector (the data blocks). This matrix product produces t(=n+k+r) code blocks. The $i^{th}$ code block is computed as: $C_i = f(g_{i1}(A_1), \ldots g_{in}(A_n))$. Here, the g's can be any functions acting on the code blocks, and $f$ a function that acts on these intermediate results to mix them, producing the $C_i$ elements. If this were a normal matrix computation over integers, the action of $g_{ij}$ is a multiplication and the action of $f$ is an addition. There is no reason, however, that these operations must be normal multiplications and additions. If one considers that the individual blocks are usually themselves long strings of information that may be mixed by the operators $g_{ij}$, each of the $g_{ij}$ can itself be considered as a matrix, operating at a finer resolution. Similarly, one may move from any (non-block) erasure code to a block erasure code just by grouping the fine scale operations into blocks. Of course, designing the code to take advantage of the block nature of the problem may produce computational savings. Decoding proceeds by inversion in the usual manner.

The present invention provides an improved data protection scheme wherein the "g" operation is instantiated by a permutation operator. In an illustrated embodiment, each $g_{ij}$ in the matrix is a superposition (preferably by XOR) of a given number of permutations of a code block. The "f" operation preferably remains XOR, although this is not a limitation. Thus, formally, the operators "g" are members of a "group ring" over a group of permutations of the blocks, with a base ring $Z_{2\text{-}residues\ mod\ 2}$. In an illustrative embodiment, the g's in the matrix preferably are based on superpositions of powers of a single cyclic permutation. In a simple example, let c be the permutation "cycle right." Thus, c acts on a block $A=a_1 \ldots a_m$ as follows: $c(a_1 \ldots a_m) \to a_m a_1 \ldots a_{(m-i)}$.

More generally, let g be a "polynomial": $b_0 * c^0 + b_1 * c^1 + b_k c^k + \ldots b_{(m-1)} * c^{(m-1)}$, where $b_k$ is a bit (0 or 1), $c^0$ is the identity ("do nothing to the data"), and $c^k$ is a cycle operation c repeated k times, e.g., the operation: "cycle the data k words right." The "+" operand here is just addition mod 2, and the action of g on a data block is then calculated by using the distributive law. For instance, if $g=c^0+c^1=1+c$, then the action of g on A is as follows:

$$(1+c)(a_1 \ldots a_m) = 1(a_1 \ldots a_m) + c(a_1 \ldots a_m)$$
$$= a_1 \ldots a_m + a_m a_1 \ldots a_{(m-1)}$$
$$= (a_1 + a_m)(a_2 + a_1) \ldots (a_m + a_{(m-1)}),$$

where the last string is a string of words, each being the XOR of two words of $a_1$. Because the coefficients $b_0 \ldots b_m$ are just 0 or 1, the operator can be identified by just a string of bits. For ease of illustration, the first bit may be the identity, which corresponds to the $c^0$ case. To further compress this representation, these bit strings can be written as integers, e.g., 1+c becomes 3, with 9 (binary 1001) represents the operator "XOR the unshifted copy with a copy of the data shifted 3 over."

Because the operators are members of a group ring, the operations of addition and multiplication are meaningful. In particular, $c^j * c^k = c^{(j+k)}$, as multiplication is the group multiplication (intuitively the operator "cycle j right of (cycle k right)" is equivalent to "cycle j+k right"). The addition operation is simply addition mod 2. For "polynomials"

algorithms for multiplication and addition are as expected. In the bit-notation for operators, addition is XOR, and multiplication is the normal bitwise multiplication algorithm, except that the additions are all done without carry (simple XORs). Thus: $5*6=101*110=101*10+101*100=11110=110*1+110*100=6*5$.

The string $(a_1+a_m) (a_2+a_1) \ldots (a_m+a_{(m-1)})$ resulting from the operation of (1+c) may be considered a "convolution" of A. A cannot be recovered from this string. If, however, there is also one "key" word of A available, a de-convolution operation can be performed to enable the whole string to be recovered. For example, assume $A^*=(1+c)A$, and the word $a_1$ is available. The $i^{th}$ word of $A^*$ is $a^*_i=(a_i+a_{(i-1)})$. By XORing $a^*_i$, the first word $A^*$, with $a_1$, the value $a_m$ can be recovered: $a^*_1+a_1=a_1+a_m+a_1=a_m$. The recovered value of $a_m$ can then be used to recover $a_{(m-1)}$ in turn: $a^*_m+a_m=a_m+a_{(m-1)}+a_m=a_{(m-1)}$. This "unzipping" process is then continued to recover the rest of the unencoded words of A in descending sequence. Formally, the elements of the group ring are not all invertible. This is seen above, as there is no operator that produces A from (1+c)A. The matrix (1+c), however, is almost invertible; indeed, given a small constant amount of additional information, one can invert the operation. Generally, how much extra information is required varies if c is changed. For instance, if a permutation d is used that just swaps even and odd words of A, the (1+d) element requires more information to invert (i.e., out of every two words, one is needed).

In an illustrated embodiment, the permutation operators preferably are sums of powers of a given cyclic permutation, where the length of the sum is less (preferably much less) than the number of words cycled (which may vary with the available buffer size). Such operators typically are only practically invertible when the sums contain one permutation. To invert a sum of two or more powers of permutations $c^{p-1}+c^{p-m}$, a key of v words is needed, where $v=p_m-p_1-1$ is one less than the difference between the largest and smallest power in the sum. For example, as illustrated above, $3=1+c$ requires a one work key to unzip, as does $6=c+c^2$, as both largest and smallest powers are one larger. The value $9=1+c^3$ requires a 3 word key to de-convolve.

For any operator, the de-convolution operation typically proceeds as described above, but using a v-word window to produce an additional decoded word. The window is then slid over one word and the process continues until complete.

A key is stored separately for each data block whose decoding requires de-convolution. The small size of each key means that its storage is not burdensome. In a representative embodiment, the keys can be replicated k times and stored with metadata, or the keys for given data blocks can be appended to other data blocks, which other data blocks preferably are chosen to insure that they are not missing in the case that a particular sub-matrix inversion requiring a specific de-convolution needs to be performed.

With the above as background, a preferred coding technique is now described. As noted above, according to the invention the "g" operators are restricted to permutation operators, with each operator being a superposition of a small number of permutations of a code block. Of course, it is desirable to choose a matrix of operators such that appropriate sub-matrices are invertible when blocks are lost, except for possibly normally uninvertible individual operators, which may be inverted by using the de-convolution procedure described above. This criteria is insured by selecting a n+k by n matrix, all of whose n by n sub-matrices have non-zero determinants. Further, preferably the matrix should be chosen so that the encode and decode operations are as computationally-efficient as possible. For the N+K case (4,2), the following matrix may be used:

1000

0100

0010

0001

1 2 1 4

1 3 3 5

As can be seen, this code takes four (4) data blocks (A1, A2, A3, A4) and produces six (6) code blocks (C0, C1, C2, C3, C4, C5). Because the identity sub-matrix is used, however, the first four code blocks (C0, C1, C2, C3) are just copies of the first four data blocks, which is a desirable result. As indicated above, it is preferred to have as much of the data as possible freely available and to only use the checksum pieces to reconstruct any of the original data that may be unavailable. The use of the identity sub-matrix ensures this desirable property. Given the [1 2 1 4] row, the C4 code block is then A1+cA2+A3+cA4; the [1 3 3 5] row generates the C5 code block as:

$A1+(1+c)A2+(1+c)A3+(1+c^2)A4.$

Further, during encoding "keys" consisting of the first few words of selected blocks are stored appropriately.

To decode, it would be desirable to be able to invert the operation encoded by all 2×2 sub-matrices formed by choosing two columns from the two code rows. For these matrices to be invertible without de-convolution, however, the determinant must be an invertible element of the group ring. If rows 2 and 4 are used, the following sub-matrix is obtained:

2 4

3 5

This sub-matrix has a determinant: $2*5+3*4=10+12=6$ (given that addition, including in the multiplication operation, is XOR). The result is not invertible, as over the operator 6 has two permutations. Indeed, to isolate one row using Gaussian elimination, one must first form two new rows, multiplying (in the ring) each by the least common multiple of the first element in each row, divided by that element. In this example, this gives: 3(2 4)=(6 12) for the first row, and 2(3 5)=(6 10) for the second row; adding these two rows together (with ring addition) produces: (0 6). Finally, de-convolution (as described above) can be used to recover that element and thus the original data.

Generalizing, the decode operation (using de-convolution as needed) will work as long only the determinant is non-zero. Preferably, an implementation of the invention does not require use of Gaussian elimination schematically as it is described above; rather, preferably the specific operations and the order of those operations used to invert each case are optimized so as to run most efficiently on the preferred computer hardware used.

As a variant, c can be selected to be a permutation with a short cycle length, e.g., permute every 4 words in a cycle. As a result, more elements become invertible. In this example, the string [7 13 14] would be invertible, as would the string [1 2 4 8]. This property can be exploited to obviate de-convolution, but potential at a cost of more XOR operations.

In general, a useful matrix should have the property of being invertible, with as few operations as possible. A suitable matrix inversion method such as Gaussian elimination can be used, with the variation that not all elements have inverses. In such case, as noted above, a diagonalized sub-matrix will not necessarily have the identity element in the column solved for; thus, de-convolution is used. Preferably, the operations used for both coding and decoding are just bitwise XOR and, as needed, de-convolution (which is itself preferably based on XOR). The cycling operation itself just requires some pointer arithmetic and/or adjusting the beginning or end of the result block. The number of XOR operations is essentially given by the number of non-zero bits involved in operators for the operations, with each "1" bit in an operator calling for another copy of a data block.

For the N+K case (6,3), one of the following matrices may be used:

$$\begin{matrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ 1 & 1 & 1 & 1 & 1 & 1 \\ 1 & 2 & 3 & 4 & 5 & 6 \\ 1 & 4 & 5 & 16 & 17 & 20 \end{matrix}$$

$$\begin{matrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ 2 & 2 & 2 & 1 & 1 & 3 \\ 2 & 6 & 3 & 3 & 2 & 2 \\ 1 & 3 & 5 & 6 & 3 & 1 \end{matrix}$$

Of course, the above are merely illustrative. Because it is desirable to have relatively small coefficients, and because encode and decode costs are relatively easy to estimate, the above-identified matrices were determined by trial and error. More sophisticated algorithms may be used to determine larger cases.

The present invention may be readily implemented in software, firmware, in special purpose hardware, or in any appropriate combination. Thus, once a suitable matrix is identified, the symbolic inversion steps are identified for each loss case given that matrix. The loss cases can then be readily implemented in code, and encode and decode processes can then be called as routines as needed to the archival and retrieval processes.

Thus, according to the present invention, an NK coder is described for use to protect data that is being distributed in an RAIN archive. The data itself may be of any type, and it may also include the archive metadata. According to the invention, the data to be distributed is encoded by a matrix operation that uses an identity sub-matrix to preserve the data words, and that uses permutation ring operators to generate the code words. The operators are preferably polynomials that are selected from a group ring of a permutation group with base ring $Z_2$. The $i^{th}$ code block is computed as: $C_i=f(g_{i1}(A_1), \ldots g_{in}(A_n))$, where f( ) is preferably addition mod 2 (i.e., XOR), and g( ) is a permutation operator, such as a polynomial of cyclic permutations. Illustrative operators include, for example, $1=s^0$ ("do nothing"), $s^n$ ("shift right n words"), $1+s^n$ (XOR, unshifted image with shifted n), and so forth. With these operators, $(1+s)(a_1a_2a_3)=(a_1+a_3)(a_2+a_1)(a_3+a_2)$. The invention is desirable as most operators are very fast. Where matrices are not invertible, the de-convolve operation can be used, i.e., given a first word a1, decode $(1+s)(A)=(((a_1+a_3)(a_2+a_1)(a_3+a_2)$. A de-convolution example is shown in FIG. 3.

Typically, a data file that is being stored in the cluster comprises a set of N data blocks that are stored in N respective nodes. The coding process in of itself does not require the data file to be broken down in this manner, however.

One of ordinary skill in the art will appreciate that the encoding technique described above is also useful in protecting against loss and enhancing speed of transmission on communication paths of information represented as data signals on such paths. Thus, more generally, the technique is useful for dispersal and reconstruction of information during communication or storage and retrieval.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

While the present invention has been described in the context of a method or process, the present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including optical disks, CD-ROMs, and magnetic-optical disks, read-only memories (ROMs), random access memories (RAMs), magnetic or optical cards, or any type of media suitable for storing electronic instructions, and each coupled to a computer system bus.

Having described my invention, what we claim is as follows:

1. A method to protect a data file against loss of data, wherein the data file comprises a set of N data blocks $A_1, \ldots, A_n$ that are stored in N respective nodes, comprising:
   generating a k×n matrix of code blocks;
   storing K code blocks in K respective nodes, distinct from the N respective nodes, wherein each code block has an $i^{th}$ code block computed as: $C_i=f(g_{i1}(A_1), \ldots g_{in}(A_n))$, where each g is a permutation operator that comprises a superposition of cyclic permutations.

2. The method as described in claim 1 wherein the function f( ) is a bitwise exclusive OR (XOR) operation.

3. The method as described in claim 1 wherein the nodes comprise a heterogeneous redundant array of independent nodes (RAIN).

4. The method as described in claim 1 wherein the superposition of cyclic permutations is of the form: $b_0*c^0 + b_1*c^1 + \ldots b_k c^k + b_{(m-1)}*c^{(m-1)}$, where $b_k$ is a bit (0 or 1), $c^0$ is an identity, and $c^k$ is a cycle operation c repeated k times.

5. The method as described in claim 4 wherein the K code blocks comprise code words associated with the following permutation operators:

[1 2 1 4]

[1 3 3 5].

6. The method as described in claim 4 wherein the K code blocks comprise code words associated with the following permutation operators:

[1 1 1 1 1 1]

[1 2 3 4 5 6]

[1 4 5 16 17 20].

7. The method as described in claim 4 wherein the K code blocks comprise code words associated with the following permutation operators:

[2 2 2 1 1 3]

[2 6 3 3 2 2]

[1 3 5 6 3 1].

8. A method of storing data comprising a set of N data blocks $A_1, \ldots, A_n$, comprising the unordered steps of:
generating a k×n matrix of code blocks;
storing the N data blocks in N respective nodes; and
storing K code blocks in K respective nodes, distinct from the N respective nodes, wherein each code block has an $i^{th}$ code block computed as: $C_i = f(g_{i1}(A_1), \ldots g_{in}(A_n))$, where each g is a permutation operator that comprises a superposition of cyclic permutations.

9. The method as described in claim 8 wherein the superposition of cyclic permutations is of the form: $b_0*c0 + b_1*c1 + \ldots b_k c^k + b_{(m-1)}*c^{(m-1)}$, where $b_k$ is a bit (0 or 1), $c^0$ is an identity, and $c^k$ is a given cycle operation c repeated k times.

10. The method as described in claim 8 wherein the function f( ) is a bitwise exclusive OR (XOR) operation.

11. In a redundant array of independent nodes, wherein a data file comprising a set of N data blocks $A_1, \ldots, A_n$ are stored in N respective nodes of the array, a method of protecting the data file against loss of data, comprising:
storing K code blocks in K respective nodes of the array, distinct from the N respective nodes, wherein each code block has an $i^{th}$ code block computed as: $C_i = f(g_{i1}(A_1), \ldots g_{in}(A_n))$, where each g is a permutation operator that comprises a superposition of cyclic permutations.

12. The method as described in claim 11 wherein the superposition of cyclic permutations is of the form: $b_0*c^0 + b_1*c^1 + \ldots b_k c^k + b_{(m-1)}*c^{(m-1)}$, where $b_k$ is a bit (0 or 1), $c^0$ is an identity, and $c^k$ is a given cycle operation c repeated k times.

13. The method as described in claim 11 further including the step of recovering a portion of the data file using the K code blocks.

14. The method as described in claim 13 wherein the step of recovering a portion of the data file performs a matrix inversion on a diagonal sub-matrix derived from the K code blocks.

15. The method as described in claim 13 wherein the step of recovering a portion of the data file includes the steps of:
performing a given operation on an available portion of a K code block using a key to recover an additional portion of the K code block; and
repeating the above step until the K code block is recovered sufficiently to enable the portion of the data file to be recovered.

16. A process for protecting against loss and for enhancing accessibility in storage or memory, or protecting against loss and enhancing speed of transmission on communication paths, of information that is represented in storage or memory, or represented as data signals on communication paths, the information comprising N data blocks $A_1, \ldots, A_n$, comprising:
dispersing the information by transmitting the N data blocks in the form of said data signals carried on multiple first communication paths, or by storing the N data blocks in N storage or memory locations;
dispersing protection information by transmitting K code blocks in the form of data signals carried on multiple second communication paths distinct from the multiple first communications paths, or by storing the K code blocks in K storage or memory locations distinct from the N storage or memory locations, wherein each code block has an $i^{th}$ code block computed as: $C_i = f(g_{i1}(A_1), \ldots g_{in}(A_n))$, where each g is a permutation operator that comprises a superposition of cyclic permutations.

17. The process as described in claim 16 wherein the superposition of cyclic permutations is of the form: $b_0*c^0 + b_1*c^1 + \ldots b_k c^k + b_{(m-1)}*c^{(m-1)}$, where $b_k$ is a bit (0 or 1), $c^0$ is an identity, and $c^k$ is a given cycle operation c repeated k times.

18. The process as described in claim 16 further including the step of recovering a portion of the information using the K code blocks.

19. The process as described in claim 18 wherein the step of recovering a portion of the information performs a matrix inversion on a diagonal sub-matrix derived from the K code blocks.

20. The process as described in claim 18 wherein the step of recovering a portion of the information includes the steps of:
performing a given operation on an available portion of a K code block using a key to recover an additional portion of the K code block; and
repeating the above step until the K code block is recovered sufficiently to enable the portion of the information to be recovered.

* * * * *